US012414268B2

(12) United States Patent
Wu et al.

(10) Patent No.: US 12,414,268 B2
(45) Date of Patent: Sep. 9, 2025

(54) IMMERSION COOLING SYSTEM

(71) Applicant: Wiwynn Corporation, New Taipei (TW)

(72) Inventors: Chia-Yi Wu, New Taipei (TW); Tsung-Han Li, New Taipei (TW); Tai-Ying Tu, New Taipei (TW); Ting-Yu Pai, New Taipei (TW)

(73) Assignee: WIWYNN CORPORATION, New Taipei (TW)

( * ) Notice: Subject to any disclaimer, the term of this patent is extended or adjusted under 35 U.S.C. 154(b) by 240 days.

(21) Appl. No.: 18/366,186

(22) Filed: Aug. 7, 2023

(65) Prior Publication Data

US 2024/0064937 A1 Feb. 22, 2024

Related U.S. Application Data

(60) Provisional application No. 63/398,985, filed on Aug. 18, 2022.

(30) Foreign Application Priority Data

Apr. 12, 2023 (TW) .................................. 112113736

(51) Int. Cl.
*H05K 7/20* (2006.01)
(52) U.S. Cl.
CPC ......... *H05K 7/203* (2013.01); *H05K 7/20318* (2013.01); *H05K 7/20327* (2013.01); *H05K 7/2039* (2013.01)
(58) Field of Classification Search
CPC ............... H05K 7/203; H05K 7/20327; H05K 7/20772; H05K 7/20809; H05K 7/20236; H05K 7/20272; H05K 1/0272; H05K 2201/064; H05K 7/20; H05K 7/20254; H05K 1/0203; H05K 3/0061; H05K 7/20263; H05K 7/20509; H05K 7/20927; H05K 7/20627; H01L 23/473; G06F 1/20; G06F 2200/201; F28D 1/05316; F28D 1/05383; F28D 2021/0028; F28F 2260/02; F28F 3/12

(Continued)

(56) References Cited

U.S. PATENT DOCUMENTS 10,842,043 B1 * 11/2020 Zhang ................ H05K 7/20254
11,924,998 B2 * 3/2024 Hnayno ............. H05K 7/20236
(Continued)

*Primary Examiner* — Mandeep S Buttar
(74) *Attorney, Agent, or Firm* — McClure, Qualey & Rodack, LLP

(57) ABSTRACT

An immersion cooling system includes a work tank, a chip device, a microchannel device, a first communication pipeline, and a first heat exchange device. The work tank includes a fluid section. The chip device is in the fluid section and has an inlet and an outlet. The chip device includes a motherboard, a chip, and a cover. The motherboard has a main surface substantially parallel to a vertical line. The cover is on the motherboard. The chip is between the cover and the motherboard. The microchannel device is in the chip device. Two ends of the microchannel device are respectively in communication with the inlet and the outlet. The first communication pipeline and the first heat exchange device are in the fluid section. Two ends of the first communication pipeline are respectively in communication with the outlet and the first heat exchange device.

21 Claims, 13 Drawing Sheets

(58) Field of Classification Search
USPC .......................................................... 361/700
See application file for complete search history.

(56) References Cited

U.S. PATENT DOCUMENTS

| | | | |
|---|---|---|---|
| 12,278,164 B1* | 4/2025 | Li | H01L 23/427 |
| 2002/0117291 A1* | 8/2002 | Cheon | G06F 1/20 |
| | | | 165/80.4 |
| 2006/0002087 A1* | 1/2006 | Bezama | H01L 23/473 |
| | | | 257/E23.098 |
| 2023/0217630 A1* | 7/2023 | Gao | H05K 7/20818 |
| | | | 361/699 |
| 2025/0016959 A1* | 1/2025 | Wang | H05K 7/20809 |

* cited by examiner

IMMERSION COOLING SYSTEM

CROSS-REFERENCES TO RELATED APPLICATIONS

This application claims the benefit of U.S. provisional application Ser. No. 63/398,985, filed on Aug. 18, 2022 and claims the priority of Patent Application No. 112113736 filed in Taiwan, R.O.C. on Apr. 12, 2023. The entirety of the above-mentioned patent applications are hereby incorporated by references herein and made a part of the specification.

BACKGROUND

Technical Field

The instant disclosure relates to an immersion cooling system, particularly to an immersion cooling system having a microchannel device.

Related Art

In the immersion cooling system known to the inventor, component(s) to be cooled is usually placed in the working fluid, and a cooling device outside the system (or outside the work tank of the system) is in communication with the component(s) to be cooled to cool the component(s) to be cooled.

SUMMARY

Since the cooling device is outside the system, the cooling device is in communication with the component(s) inside the system (or inside the work tank of the system) from the exterior of the system (or the exterior of the work tank of the system). Therefore, a relative longer communication pipeline is needed for such cooling device, and thus a higher pumping power is needed to be consumed to achieve a desired cooling performance of the system.

Accordingly, in some embodiments, an immersion cooling system comprising a work tank, a chip device, a microchannel device, a first communication pipeline, and a first heat exchange device is provided. The work tank comprises a fluid section. The chip device is in the fluid section, and the chip device has an inlet and an outlet. The chip device comprises a motherboard, a chip, and a cover. The motherboard has a main surface substantially parallel to a vertical line. The cover is on the motherboard. The chip is between the cover and the motherboard. The microchannel device is in the chip device. A first end of the microchannel device is in communication with the inlet, and a second end of the microchannel device is in communication with the outlet. The first communication pipeline is in the fluid section, and a first end of the first communication pipeline is in communication with the outlet. The first heat exchange device is in the fluid section and in communication with a second end of the first communication pipeline.

DETAILED DESCRIPTION

Figure 1:
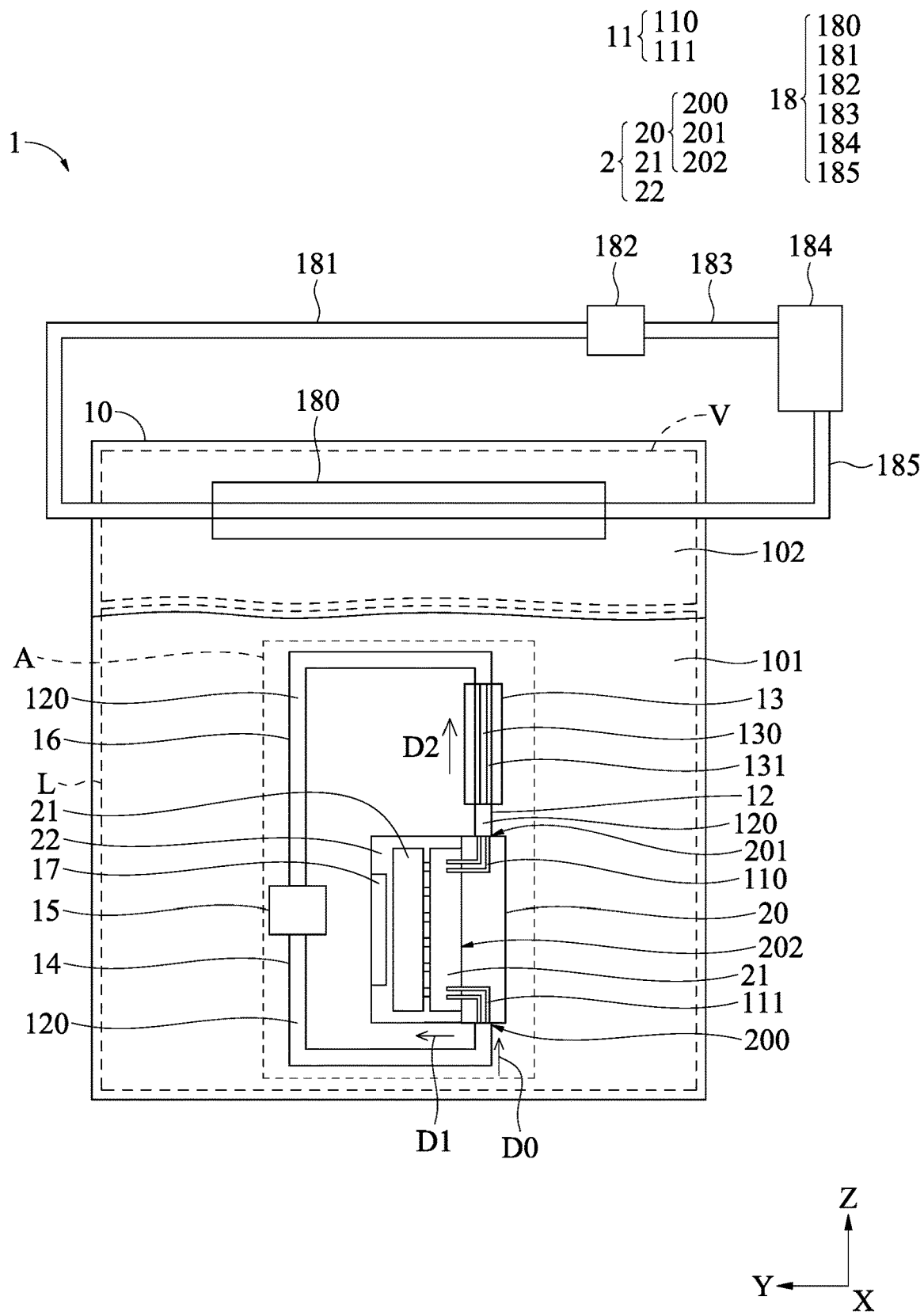
FIG. 1 illustrates a schematic perspective view of an immersion cooling system according to a first embodiment.

Please refer to FIG. 1. FIG. 1 illustrates a schematic perspective view of an immersion cooling system 1 according to a first embodiment. In FIG. 1, an immersion cooling system 1 comprises a work tank 10, a chip device 2, a microchannel device 11, a first communication pipeline 12, and a first heat exchange device 13. The work tank 10 is adapted to receive a working fluid (e.g., the liquid-phase working fluid 101, which will be described later) and comprises a fluid section L and a vapor section V. The fluid section L is adapted to receive a liquid-phase working fluid 101, and the vapor section V is adapted to receive a mixed gas-phase fluid 102 (which comprises a gas-phase working fluid and/or moisture mixed therein, and will be described later). The chip device 2 is in the fluid section L and has an inlet 200 and an outlet 201 (which will be described later). The chip device 2 comprises a motherboard 20, a chip 21, and a cover 22. The motherboard 20 has a main surface 202, and the main surface 202 is substantially parallel to a vertical line (e.g., the Z direction shown in FIG. 1); that is, in the case that the main surface 202 is substantially parallel to the vertical line, an acute angle may be between the main surface 202 and the vertical line (e.g., the Z direction shown in FIG. 1), and the acute angle is, for example, less than 45 degrees. The number of the chip 21 may be one or more, which is not limited herein. For example, a plurality of the chips 21 may be three-dimensional integrated (e.g., integrated along a direction perpendicular to the main surface 202; for example, the stacking direction D1 shown in FIG. 1) to form a chip-stacked structure (or referred to as a chip-integrated structure). The cover 22 is on the motherboard 20 (which will be described later). The chip(s) 21 is between the cover 22 and the motherboard 20; for example, a closed space is formed between the cover 22 and the motherboard 20 to further receive the chip(s) 21. The microchannel device 11 is in the chip device 2. A first end of the microchannel device 11 is in communication with the inlet 200, and a second end of the microchannel device 11 is in communication with the outlet 201 (which will be described later). The first communication pipeline 12 is in the fluid section L, and a first end of the first communication pipeline 12 is in communication with the outlet 201 (which will be described later). The materials of the first communication pipeline 12 may comprise at least one selected from the group consisting of metal, alloy, ceramic, plastic, and rubber, which is not limited herein. The first heat exchange device 13 is in the fluid section L, and the first heat exchange device 13 is in communication with a second end of the first communication pipeline 12 (which will be described later). Hence, by configuring the chip device 2 to be in communication with the liquid-phase working fluid 101 and the microchannel device 11, the chip device 2 can be cooled sufficiently. Furthermore, through the first communication pipeline 12 and the first heat exchange device 13 that are both in the fluid section L and in communication with the chip device 2, problems encountered by the cooling device known to the inventor (which is outside the system) can be avoided. For example, the following problems can be avoided, such as the needs of longer communication pipelines and even a higher pumping power to achieve the desired cooling performance.

Please still refer to FIG. 1. In some embodiments, the work tank 10 is adapted to receive a working fluid and the component(s) to be cooled. The component(s) to be cooled may be any device having a temperature higher than the temperature of the working fluid (e.g., the liquid-phase working fluid 101); for example, the component(s) to be cooled may be the chip device 2 shown in FIG. 1. The working fluid (or referred to as the heat transfer fluid) is a non-conductive fluid. Under normal circumstances (i.e., at a temperature lower than the boiling point of the working fluid), the working fluid is a liquid (i.e., the liquid-phase working fluid 101), and the boiling point of the working fluid is lower than or substantially equal to the temperature of the component(s) to be cooled. Hence, when the component(s) to be cooled is immersed in the liquid-phase working fluid 101, the liquid-phase working fluid 101 may absorb the heat from the component(s) to be cooled and thus the temperature of the liquid-phase working fluid 101 reaches its critical boiling point rapidly, so that the liquid-phase working fluid 101 is further evaporated as a gas-phase working fluid.

Please still refer to FIG. 1. In some embodiments, the first heat exchange device 13 may be a boiler plate. Specifically, in some embodiments, the first heat exchange device 13 comprises a partition plate 130 and a plurality of heat exchange channels 131. The partition plate 130 is adapted to partition the heat exchange channels 131. The heat exchange channels 131 are correspondingly in communication with the second end of the first communication pipeline 12. The microchannel device 11 and the first heat exchange device 13 (and the heat exchange channels 131 of the first heat exchange device 13) are adapted to be applied with a circulation fluid 120, and the circulation fluid 120 may be a fluid identical to or different from the liquid-phase working fluid 101, which is not limited herein. In some embodiments, the diameter of each of the heat exchange channels 131 is less than the diameter of the second end of the first communication pipeline 12. Hence, the circulation fluid 120 inside the first communication pipeline 12 may be distributed over the heat exchange channels 131, so that the distributed circulation fluid 120 may conduct heat exchange synchronously and more sufficiently. The materials of the partition plate 130 and the heat exchange channels 131 may independently be any material with thermal conductive function, which is not limited herein; for example, the materials may be metal, alloy, or a combination thereof.

In some embodiments, the immersion cooling system 1 further comprises a second heat exchange device 18, wherein the second heat exchange device 18 is in the vapor section V. For example, still referring to FIG. 1, the second heat exchange device 18 comprises a condenser 180, wherein the condenser 180 is in the vapor section V; for example, the condenser 180 is located above the surface of the liquid-phase working fluid 101. The condenser 180 may be applied with a cooling fluid, and both the condenser 180 and the cooling fluid of the condenser 180 have a temperature lower than the temperature of the mixed gas-phase fluid 102; for example, a temperature lower than the dew point or the boiling point of the working fluid. Therefore, when the gas-phase working fluid in the mixed gas-phase fluid 102 contacts the condenser 180, a heat exchange between the gas-phase working fluid and the condenser 180 may be conducted. The temperature of the gas-phase working fluid would be then reduced, and the gas-phase working fluid would be condensed into the liquid-phase working fluid 101 to flow back to the fluid section L and be reused for cooling the component(s) to be cooled (e.g., the chip device 2 shown in FIG. 1). Accordingly, through the liquid-phase working fluid 101 reused in the closed environment, the required usage of the liquid-phase working fluid 101 can be prevented from being unnecessarily increased, thereby enhancing the cooling performance provided by per unit of the liquid-phase working fluid 101.

Please still refer to FIG. 1. In some embodiments, the second heat exchange device 18 further comprises a condensation pump 182 and a heat exchanger 184. The condensation pump 182 and the heat exchanger 184 are independently inside or outside the work tank 10, which is not limited herein. For example, in FIG. 1, the condensation pump 182 and the heat exchanger 184 are both outside the work tank 10, and only the condenser 180 is inside the work tank 10 (e.g., in the vapor section V of the work tank 10). The condensation pump 182 may be any device that can increase the pressure of the fluid inside the device, which is not limited herein. A first end of the condensation pump 182 is in communication with a first end of the condenser 180 (for example, through a first condensation pipe 181). A second end of the condensation pump 182 is in communication with a first end of the heat exchanger 184 (for example, through a second condensation pipe 183). A second end of the heat exchanger 184 is in communication with a second end of the condenser 180 (for example, through a third condensation pipe 185). The materials of the first condensation pipe 181, the second condensation pipe 183, and the third condensation pipe 185 may independently comprise at least one selected from the group consisting of metal, alloy, ceramic, plastic, and rubber, which is not limited herein. Accordingly, through a condensation circulation formed by the condenser 180, the condensation pump 182, and the heat exchanger 184, the cooling fluid from the condenser 180 (with a higher temperature) can be cooled by decreasing the temperature of the cooling fluid to be lower than the dew point or the boiling point of the working fluid, so that the cooling fluid is pumped back to the condenser 180 to condense the gas-phase working fluid. Hence, the liquid-phase working fluid 101 in the work tank 10 can be recycled and reused for cooling the component(s) to be cooled (e.g., the chip device 2 shown in FIG. 1).

In some embodiments, the inlet 200 is selectively on at least one of the motherboard 20 and the cover 22; and the outlet 201 is selectively on at least one of the motherboard 20 and the cover 22. In other words, in some embodiments, the inlet 200 is selectively on the motherboard 20, or on the cover 22, or on both the motherboard 20 and the cover 22; and the outlet 201 is selectively on the motherboard 20, or on the cover 22, or on both the motherboard 20 and the cover 22.

Figure 4:
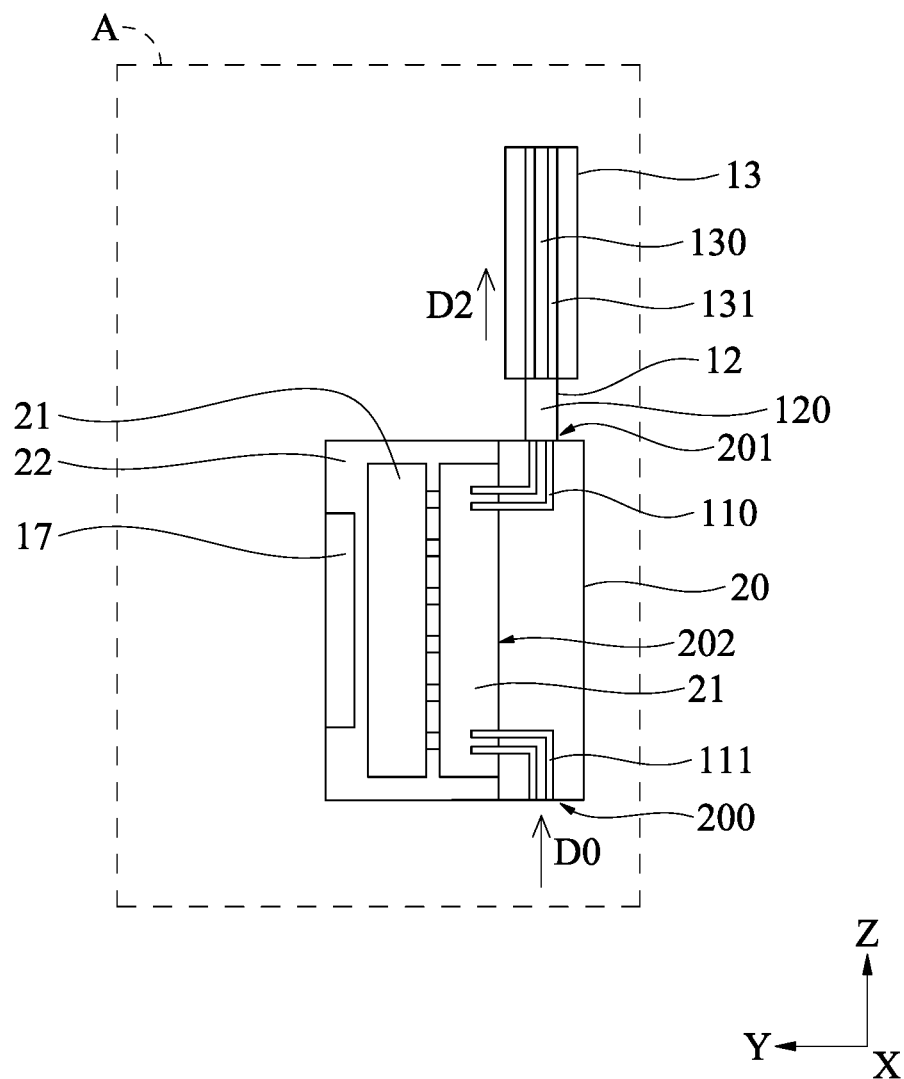
FIG. 4 illustrates a schematic perspective view of a partial section A of the immersion cooling system shown in FIG. 1 according to a fourth embodiment.

For example, referring to both FIG. 1 and FIG. 4, FIG. 4 illustrates a schematic perspective view of a partial section A of the immersion cooling system 1 shown in FIG. 1 according to a fourth embodiment. In FIG. 4, the inlet 200 is on the motherboard 20, and the outlet 201 is also on the motherboard 20. The microchannel device 11 comprises a first microchannel 110 and a second microchannel 111. The circulation fluid 120 can enter the second microchannel 111 from the inlet 200 (along an entering direction DO) and be discharged from the first microchannel 110, so that the chip device 2 (shown in FIG. 1) and the chip(s) 21 of the chip device 2 can be cooled sufficiently by the circulation fluid 120.

Specifically, still referring to FIG. 1 and FIG. 4, in some embodiments, the number of the first microchannel 110 may be one or more, and the first communication pipeline 12 is in communication with the first microchannel(s) 110 through the outlet(s) 201. For example, a first end of the first microchannel 110 is in communication with the chip(s) 21, a second end of the first microchannel 110 is in communication with the outlet 201, and the diameter of the first microchannel 110 is less than the diameter of the first communication pipeline 12. Furthermore, the first end of each of the first microchannels 110 may be configured between one or more chips 21 according to the patterns and/or the stacking of the chips 21. The number of the second microchannel 111 may be one or more, and each of the second microchannels 111 is correspondingly in communication with the inlet 200. For example, a first end of the second microchannel 111 is in communication with the chip(s) 21, and a second end of the second microchannel 111 is in communication with the inlet 200. Furthermore, the first end of each of the second microchannels 111 may be configured between one or more chips 21 according to the patterns and/or the stacking of the chips 21.

The first microchannel 110 and the second microchannel 111 in the chip device 2 (e.g., at least in the chip(s) 21) are substantially in communication with each other, and the circulation fluid 120 can flow inside the first microchannel 110 and the second microchannel 111. The materials of the first microchannel 110 and the second microchannel 111 may independently be plastic, rubber, and a combination thereof, which is not limited herein. Hence, through the circulation fluid 120 inside the first microchannel 110 and the second microchannel 111, the chip(s) 21 can be cooled sufficiently. In this embodiment, the circulation fluid 120 may be a fluid identical to the liquid-phase working fluid 101 (shown in FIG. 1), and thus the contamination between the fluids in the work tank 10 can be avoided. Accordingly, in some embodiments, the inlet 200 is not necessarily needed to be in communication with other communication pipelines (e.g., the second communication pipeline 14) and/or the pump 15 (which will be described later). Due to the capillary action and/or thermal convection, the circulation fluid 120 (that is, the liquid-phase working fluid 101 in this embodiment) can still enter the second microchannel 111 through the inlet 200, so that the chip device 2 (shown in FIG. 1) and the chip(s) 21 of the chip device 2 can be cooled sufficiently.

Figure 3:
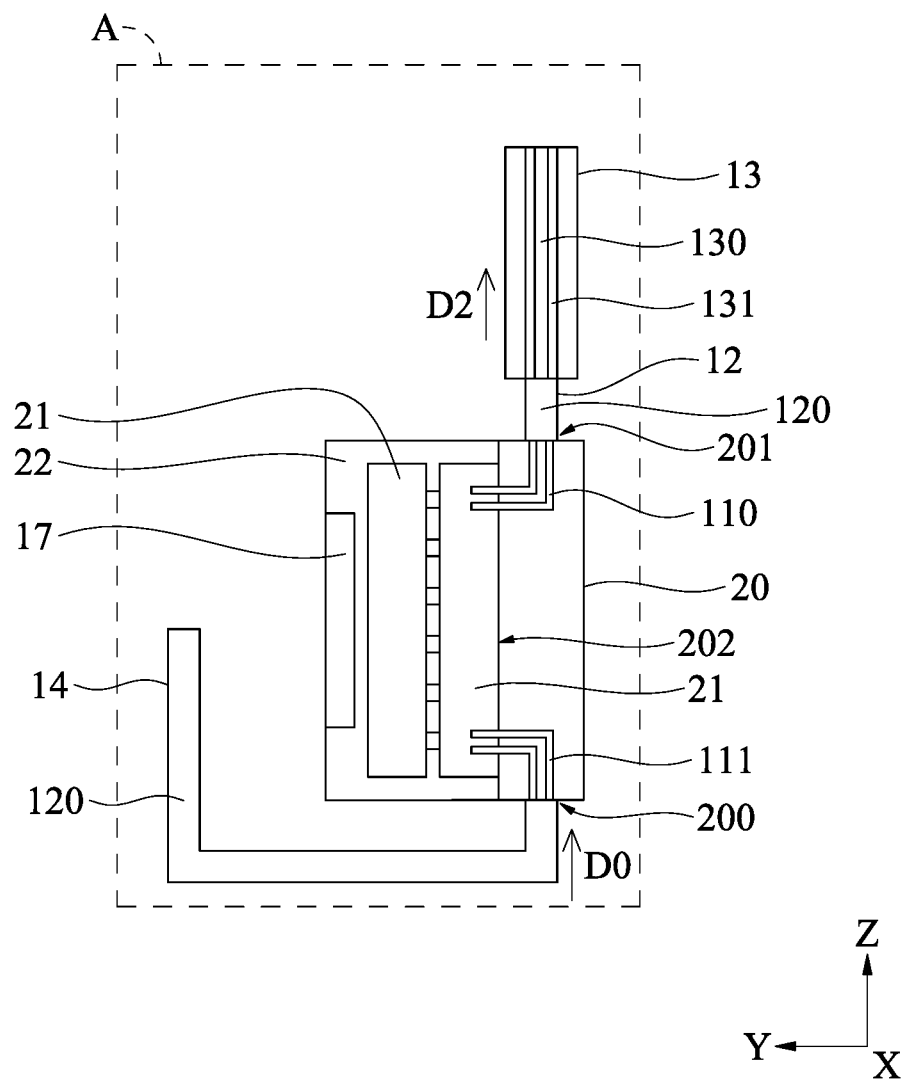
FIG. 3 illustrates a schematic perspective view of a partial section A of the immersion cooling system shown in FIG. 1 according to a third embodiment.

For another example, referring to both FIG. 1 and FIG. 3, FIG. 3 illustrates a schematic perspective view of a partial section A of the immersion cooling system 1 shown in FIG. 1 according to a third embodiment. In FIG. 3, the inlet 200 is on the motherboard 20, and the outlet 201 is also on the motherboard 20. Moreover, the immersion cooling system 1 further comprises a second communication pipeline 14, wherein the second communication pipeline 14 is in the fluid section L, the second communication pipeline 14 is in communication with the inlet 200, and the diameter of the second microchannel 111 is less than the diameter of the second communication pipeline 14. The materials of the second communication pipeline 14 may comprise at least one selected from the group consisting of metal, alloy, ceramic, plastic, and rubber, which may be identical to or different from the materials of the first communication pipeline 12 and is not limited herein. In this embodiment, the circulation fluid 120 may be a fluid identical to the liquid-phase working fluid 101 (shown in FIG. 1), and thus the contamination between the fluids in the work tank 10 can be avoided. Accordingly, in some embodiments, the inlet 200 and the second communication pipeline 14 are not necessarily needed to be in communication with other pumps 15 (which will be described later). Due to the capillary action and/or thermal convection, the circulation fluid 120 (that is, the liquid-phase working fluid 101 in this embodiment) can still enter the second microchannel 111 through the second communication pipeline 14 and the inlet 200, so that the chip device 2 (shown in FIG. 1) and the chip(s) 21 of the chip device 2 can be cooled sufficiently. Furthermore, through the second communication pipeline 14 that is also in the fluid section L of the work tank 10 (shown in FIG. 1) and in communication with the chip device 2, problems encountered by the cooling device known to the inventor (which is outside the system) can be avoided by the immersion cooling system 1 according to some embodiments.

Figure 2:
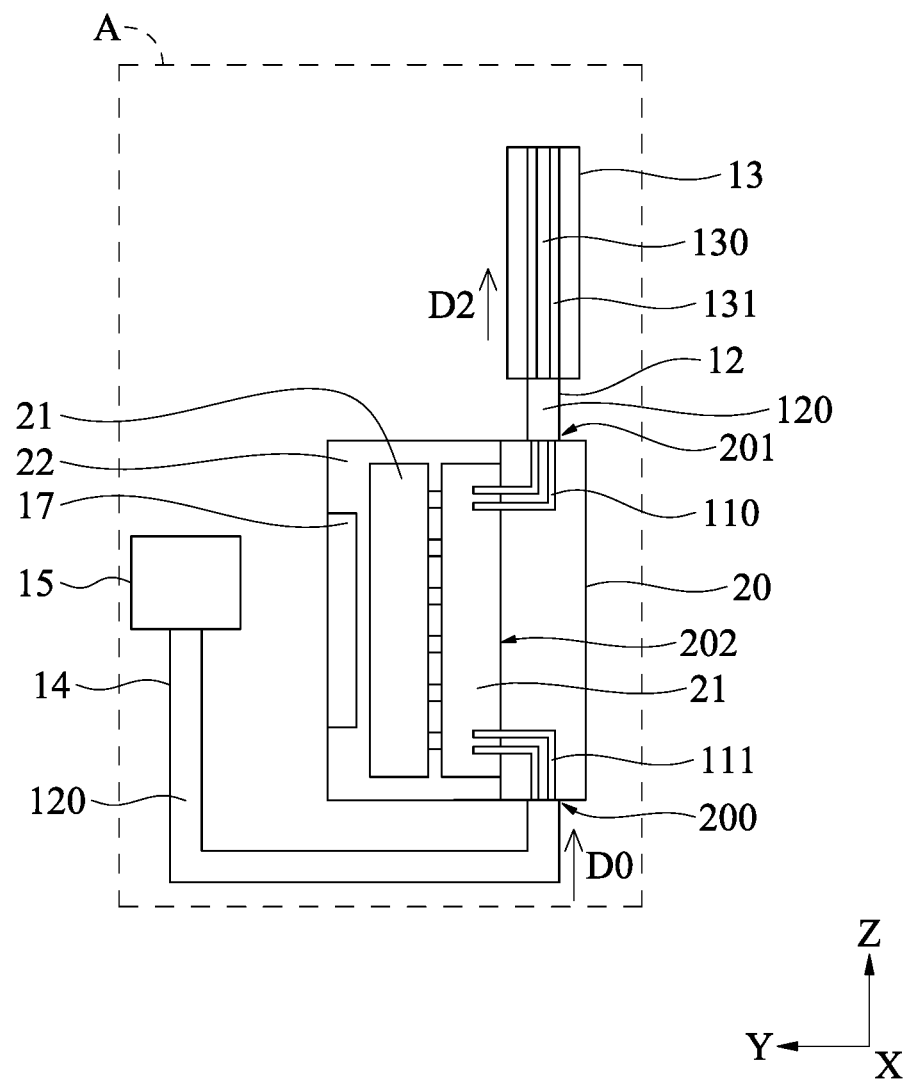
FIG. 2 illustrates a schematic perspective view of a partial section A of the immersion cooling system shown in FIG. 1 according to a second embodiment.

For another example, referring to both FIG. 1 and FIG. 2, FIG. 2 illustrates a schematic perspective view of a partial section A of the immersion cooling system 1 shown in FIG. 1 according to a second embodiment. In FIG. 2, the inlet 200 is on the motherboard 20, and the outlet 201 is also on the motherboard 20. Moreover, the immersion cooling system 1 further comprises a pump 15, wherein the pump 15 is in the fluid section L, and the pump 15 is in communication with the second communication pipeline 14. For example, in FIG. 2, two ends of the second communication pipeline 14 are respectively in communication with the pump 15 and the inlet 200. In this embodiment, the circulation fluid 120 may be a fluid identical to the liquid-phase working fluid 101 (shown in FIG. 1), and thus the contamination between the fluids in the work tank 10 can be avoided. The condensation pump 182 may be any device that can increase the pressure of the fluid inside the device, which is not limited herein. In addition to the capillary action and/or thermal convection, due to the pumping of the pump 15, the circulation fluid 120 (that is, the liquid-phase working fluid 101 in this embodiment) can enter the second microchannel 111 through the second communication pipeline 14 and the inlet 200, so that the chip device 2 (shown in FIG. 1) and the chip(s) 21 of the chip device 2 can be cooled more rapidly and sufficiently. Furthermore, through the pump 15 that is also in the fluid section L of the work tank 10 (shown in FIG. 1) and in communication with the chip device 2 and the second communication pipeline 14, problems encountered by the cooling device known to the inventor (which is outside the system) can be avoided by the immersion cooling system 1 according to some embodiments.

In some embodiments, the chip device 2 is electrically connected to the pump 15 to supply electricity for the pump 15, and the chip device 2 may transmit a control signal to pump 15 so as to control the pump 15 (for example, to actuate the pump 15 for pumping the circulation fluid 120). In some embodiments, the pump 15 is on the motherboard 20 of the chip device 2 so as to be electrically connected to the motherboard 20 and to receive the control signal from the chip device 2 and the chip(s) 21 of the chip device 2. Accordingly, the pump 15 is not necessarily needed to be connected to an additional power supply and/or control device (e.g., an IPC), and thus an unnecessary increase on the cost due to the contamination of the liquid-phase working fluid 101 can be avoided.

For another example, still referring to FIG. 1, in FIG. 1, the inlet 200 is on the motherboard 20, and the outlet 201 is also on the motherboard 20. Moreover, the immersion cooling system 1 further comprises a third communication pipeline 16, wherein the third communication pipeline 16 is in the fluid section L, a first end of the third communication pipeline 16 is in communication with the first heat exchange device 13, and a second end of the third communication pipeline 16 is in communication with the pump 15. In this embodiment, due to a closed circulation formed by the chip device 2, the microchannel device 11, the first communication pipeline 12, the first heat exchange device 13, the third communication pipeline 16, the pump 15, and the second communication pipeline 14, the circulation fluid 120 may be a fluid identical to or different from the liquid-phase working fluid 101, which is not limited herein. Accordingly, the circulation fluid 120 can be independently discharged from the outlet 201 so as to conduct heat exchange with the first heat exchange device 13 and pumped by the pump 15, and the circulation fluid 120 is further transported back to the second microchannel 111 through the second communication pipeline 14 and the inlet 200, so that the chip device 2 and the chip(s) 21 of the chip device 2 can be cooled sufficiently. Furthermore, in addition to the pump 15 and the second communication pipeline 14, through the third communication pipeline 16 that is also in the fluid section L of the work tank 10 and in communication with the pump 15 and the first heat exchange device 13, problems encountered by the cooling device known to the inventor (which is outside the system) can be avoided by the immersion cooling system 1 according to some embodiments.

Figure 6:
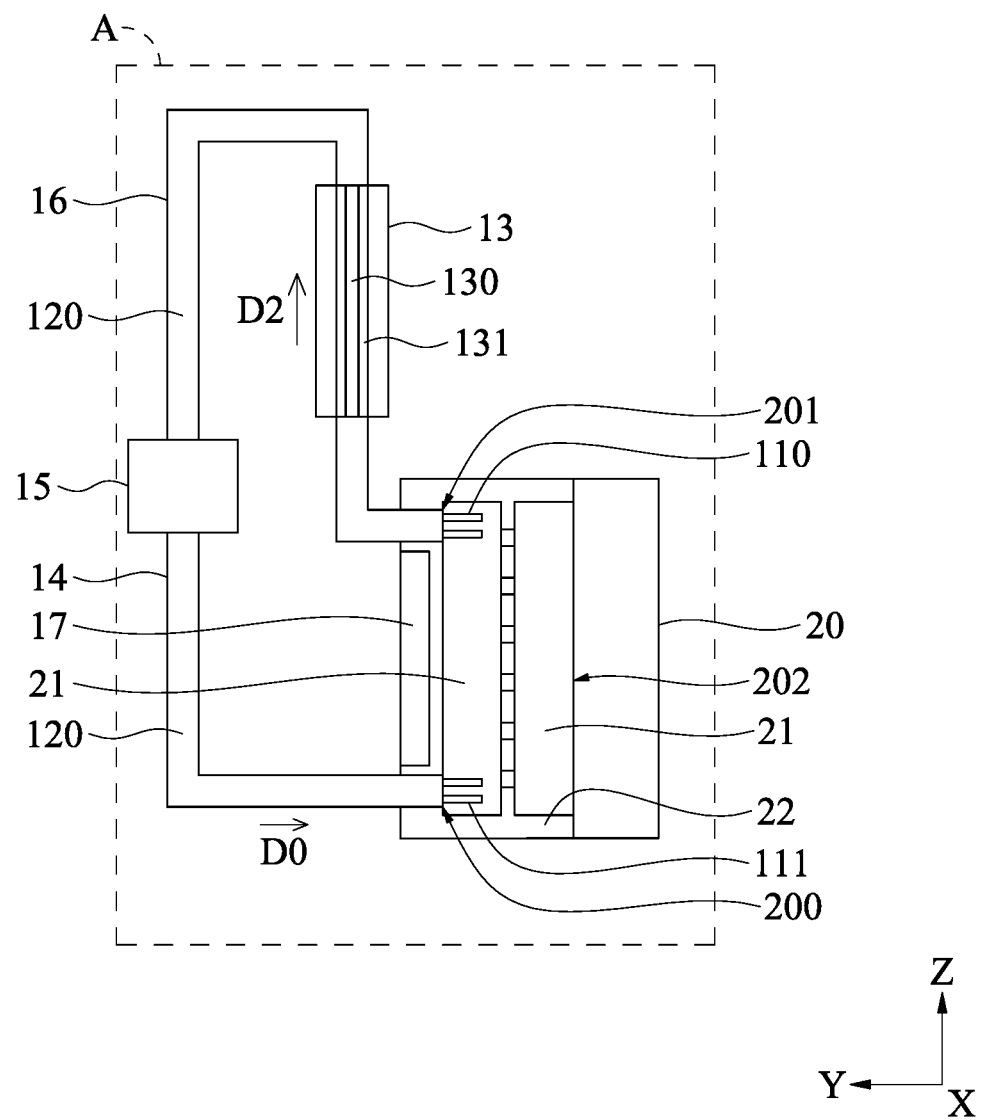
FIG. 6 illustrates a schematic perspective view of a partial section A of the immersion cooling system shown in FIG. 1 according to a sixth embodiment.

For another example, referring to both FIG. 1 and FIG. 6, FIG. 6 illustrates a schematic perspective view of a partial section A of the immersion cooling system 1 shown in FIG. 1 according to a sixth embodiment. In FIG. 6, the inlet 200 is on the cover 22, and the outlet 201 is also on the cover 22. The materials of the cover 22 may be any material with thermal conductive function, which is not limited herein. Moreover, in this embodiment, the immersion cooling system 1 may optionally comprise the second communication pipeline 14, the pump 15, and the third communication pipeline 16; detail configurations of the implementations can be referred to above descriptions and thus will not be further described in detail herein. Therefore, through various configurations of the inlet 200 and the outlet 201, according to some embodiments, the immersion cooling system 1 that can prevent from the problems encountered by the cooling device known to the inventor (which is outside the system) is provided. Furthermore, through the cover 22 that is also in the fluid section L and has thermal conductive function, the heat of the chip device 2 (shown in FIG. 1) can be thermally conducted outward by the cover 22, and the heat then conducts heat exchange with the liquid-phase working fluid 101, so that the chip device 2 (shown in FIG. 1) and the chip(s) 21 of the chip device 2 can be cooled.

Figure 7:
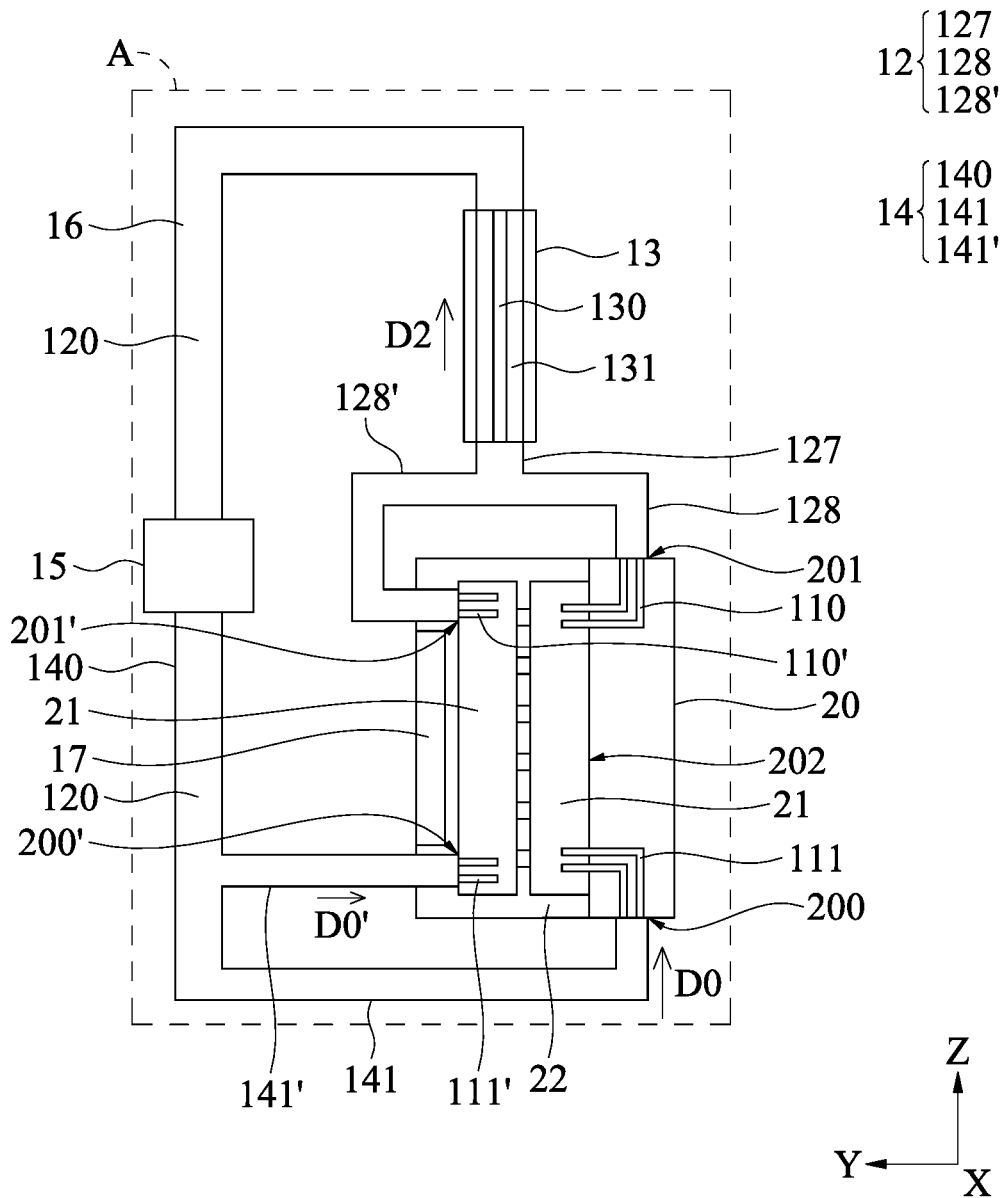
FIG. 7 illustrates a schematic perspective view of a partial section A of the immersion cooling system shown in FIG. 1 according to a seventh embodiment.

For another example, referring to both FIG. 1 and FIG. 7, FIG. 7 illustrates a schematic perspective view of a partial section A of the immersion cooling system 1 shown in FIG. 1 according to a seventh embodiment. In FIG. 7, the inlet (including the inlet 200 and the inlet 200') is on both the motherboard 20 and the cover 22 at the same time (that is, in this embodiment, the inlet 200 is on the motherboard 20, and the inlet 200' is on the cover 22), and the outlet (including the outlet 201 and the outlet 201') is on both the motherboard 20 and the cover 22 at the same time (that is, in this embodiment, the outlet 201 is on the motherboard 20, and the outlet 201' is on the cover 22). The microchannel device 11 comprises a plurality of first microchannels 110, 110' and a plurality of second microchannels 111, 111'. The circulation fluid 120 may enter the second microchannel 111 from the inlet 200 (along the entering direction D0) and be discharged from the first microchannel 110, while the circulation fluid 120 may also enter the second microchannel 111' from the inlet 200' (along the entering direction D0') and be discharged from the first microchannel 110'. Therefore, the chip device 2 (shown in FIG. 1) and the chip(s) 21 of the chip device 2 can be cooled efficiently.

Specifically, still referring to FIG. 1 and FIG. 7, the first communication pipeline 12 is in communication with the first microchannel 110 through the outlet 201, and the first communication pipeline 12 is in communication with the first microchannel 110' through the outlet 201'. For example, the first end of each of the first microchannels 110, 110' is in communication with the chip(s) 21, the second ends of the first microchannels 110, 110' are respectively in communication with the outlets 201, 201', and the diameter of each of the first microchannels 110, 110' is less than the diameter of the first communication pipeline 12. Furthermore, the first end of each of the first microchannels 110, 110' may be configured between one or more chips 21 according to the patterns and/or the stacking of the chips 21. The second microchannel 111 is in communication with the inlet 200, and the second microchannel 111' is in communication with the inlet 200'. For example, the first end of each of the second microchannels 111, 111' is in communication with the chip(s) 21, and the second ends of the second microchannels 111, 111' are respectively in communication with the inlets 200, 200'. Furthermore, the first end of each of the second microchannels 111, 111' may be configured between one or more chips 21 according to the patterns and/or the stacking of the chips 21. The materials of the first microchannel 110 and the first microchannel 110' may be identical to or different from each other, and the materials of the second microchannel 111 and the second microchannel 111' may be identical to or different from each other, both of which are not limited herein. Moreover, in this embodiment, the immersion cooling system 1 may comprise the second communication pipeline 14, or comprise the second communication pipeline 14 and the pump 15, or comprise the second communication pipeline 14, the pump 15, and the third communication pipeline 16; detail configurations of the implementations can be referred to above descriptions and thus will not be further described in detail herein. Therefore, through various configurations of the inlets 200, 200' and the outlets 201, 201', according to some embodiments, the immersion cooling system 1 (shown in FIG. 1) that can prevent from the problems encountered by the cooling device known to the inventor (which is outside the system) is provided.

For example, in FIG. 7, the first communication pipeline 12 comprises a first main pipeline 127 and a plurality of first sub-pipelines 128, 128'. A first end of each of the first sub-pipelines 128, 128' is in communication with the first main pipeline 127, so that the first sub-pipelines 128, 128' may be in communication with the first heat exchange device 13. The second end of the first sub-pipeline 128 is in communication with the outlet 201, so that the first sub-pipeline 128 may be in communication with the first microchannel 110 through the outlet 201. The second end of the first sub-pipeline 128' is in communication with the outlet 201', so that the first sub-pipeline 128' may be in communication with the first microchannel 110' through the outlet 201'. The diameters of the first main pipeline 127 and the first sub-pipelines 128, 128' are not limited; for example, the diameters of the first sub-pipelines 128, 128' are both less than the diameter of the first main pipeline 127. The materials of the first main pipeline 127 and the first sub-pipelines 128, 128' may independently comprise at least one selected from the group consisting of metal, alloy, ceramic, plastic, and rubber, and the materials of the first main pipeline 127 and the first sub-pipelines 128, 128' may be identical to or different form each other, both of which are not limited herein. Moreover, in this embodiment, the immersion cooling system 1 may comprise the second communication pipeline 14, or comprise the second communication pipeline 14 and the pump 15, or comprise the second communication pipeline 14, the pump 15, and the third communication pipeline 16, detail configurations of the implementations can be referred to above descriptions and thus will not be further described in detail herein Therefore, through various configurations of the inlets 200, 200' and the outlets 201, 201', according to some embodiments, the immersion cooling system 1 (shown in FIG. 1) that can prevent from the problems encountered by the cooling device known to the inventor (which is outside the system) is provided.

For another example, in FIG. 7, the immersion cooling system 1 further comprises a second communication pipeline 14, wherein the second communication pipeline 14 is in the fluid section L and the second communication pipeline 14 comprises a second main pipeline 140 and a plurality of second sub-pipelines 141, 141'. The second sub-pipeline 141 is in communication with the inlet 200, so that the second sub-pipeline 141 may be in communication with the second microchannel 111 through the inlet 200. The second sub-pipeline 141' is in communication with the inlet 200', so that the second sub-pipeline 141' may be in communication with the second microchannel 111' through the inlet 200'. The diameters of the second main pipeline 140 and the second sub-pipelines 141, 141' are not limited; for example, the diameters of the second sub-pipelines 141, 141' are both less than the diameter of the second main pipeline 140. The materials of the second main pipeline 140 and the second sub-pipelines 141, 141' may independently comprise at least one selected from the group consisting of metal, alloy, ceramic, plastic, and rubber, and the materials of the second main pipeline 140 and the second sub-pipelines 141, 141' may be identical to or different form each other, both of which are not limited herein. Moreover, in this embodiment, the immersion cooling system 1 may comprise the pump 15 or comprise the pump 15 and the third communication pipeline 16, detail configurations of the implementations can be referred to above descriptions and thus will not be further described in detail herein. Therefore, through various configurations of the inlets 200, 200' and the outlets 201, 201', according to some embodiments, the immersion cooling system 1 (shown in FIG. 1) that can prevent from the problems encountered by the cooling device known to the inventor (which is outside the system) is provided.

Figure 5:
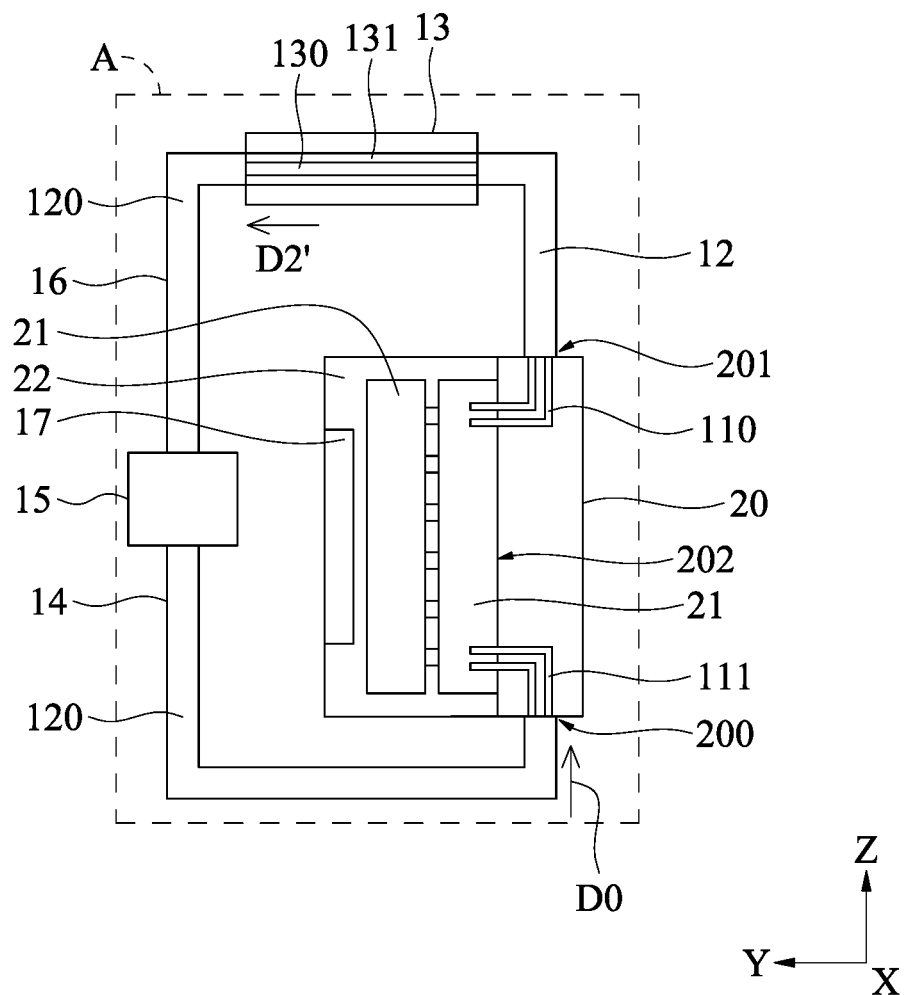
FIG. 5 illustrates a schematic perspective view of a partial section A of the immersion cooling system shown in FIG. 1 according to a fifth embodiment.

Please refer to both FIG. 1 and FIG. 5. FIG. 5 illustrates a schematic perspective view of a partial section A of the immersion cooling system 1 shown in FIG. 1 according to a fifth embodiment. The heat exchange channels 131 of the first heat exchange device 13 in general have a flow direction D2 (shown in FIG. 1; or the flow direction D2' shown in FIG. 5). According to various demands, the flow directions D2, D2' may be configured to have different angles with respect to the vertical line (e.g., the Z directions shown in FIG. 1 and FIG. 5). For example, in FIG. 1, the first heat exchange device 13 is adjacent to the chip device 2, and the flow direction D2 of the heat exchange channel 131 is substantially parallel to the vertical line (that is, an angle is between the flow direction D2 and the vertical line, and the angle is less than, for example, 45 degrees). Therefore, after the circulation fluid 120 (or the liquid-phase working fluid 101) is discharged from the outlet 201, the circulation fluid 120 (or the liquid-phase working fluid 101) can directly enter the interior of the heat exchange channels 131 to conduct heat exchange rapidly. Alternatively, for another example, in FIG. 5, the length of the first communication pipeline 12 is relatively longer, and thus the first heat exchange device 13 is configured away from the chip device 2, and the flow direction D2' of the heat exchange channel 131 is substantially perpendicular to the vertical line (that is, an angle is between the flow direction D2' and the vertical line, and the angle is, for example, 90 degrees±45 degrees). Therefore, after the circulation fluid (or the liquid-phase working fluid 101) is discharged from the outlet 201, the circulation fluid 120 (or the liquid-phase working fluid 101) can conduct heat exchange thoroughly in the relatively longer first communication pipeline 12, and thus the circulation fluid 120 (or the liquid-phase working fluid 101) with a lower temperature (i.e., a greater temperature difference is between the circulation fluid 120 and the first heat exchange device 13) may enter the first heat exchange device 13, thereby reducing the work loading of the first heat exchange device 13.

Figure 8A:
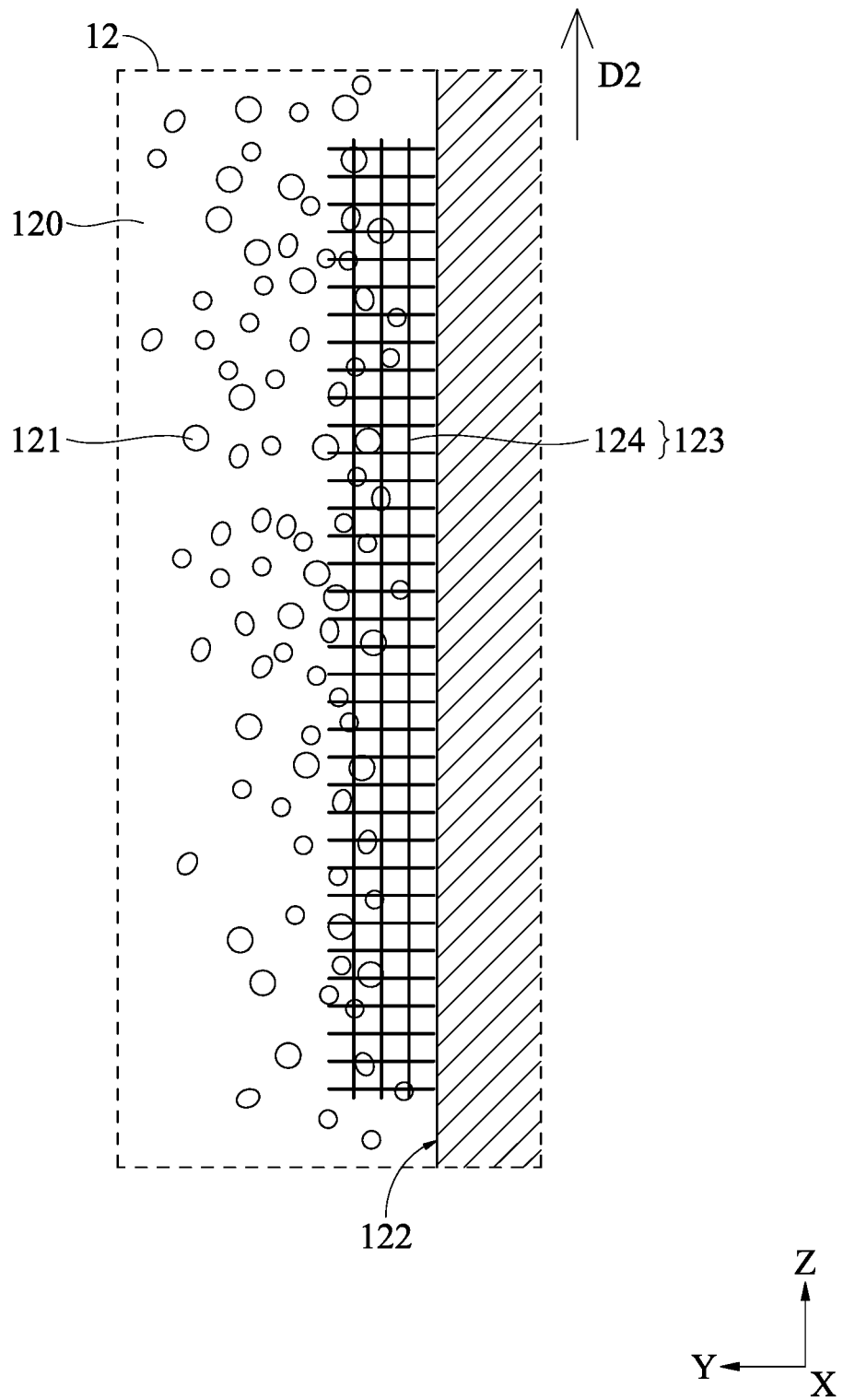
FIG. 8A illustrates a cross-sectional schematic view of the first communication pipeline according to some embodiments.
Figure 8B:
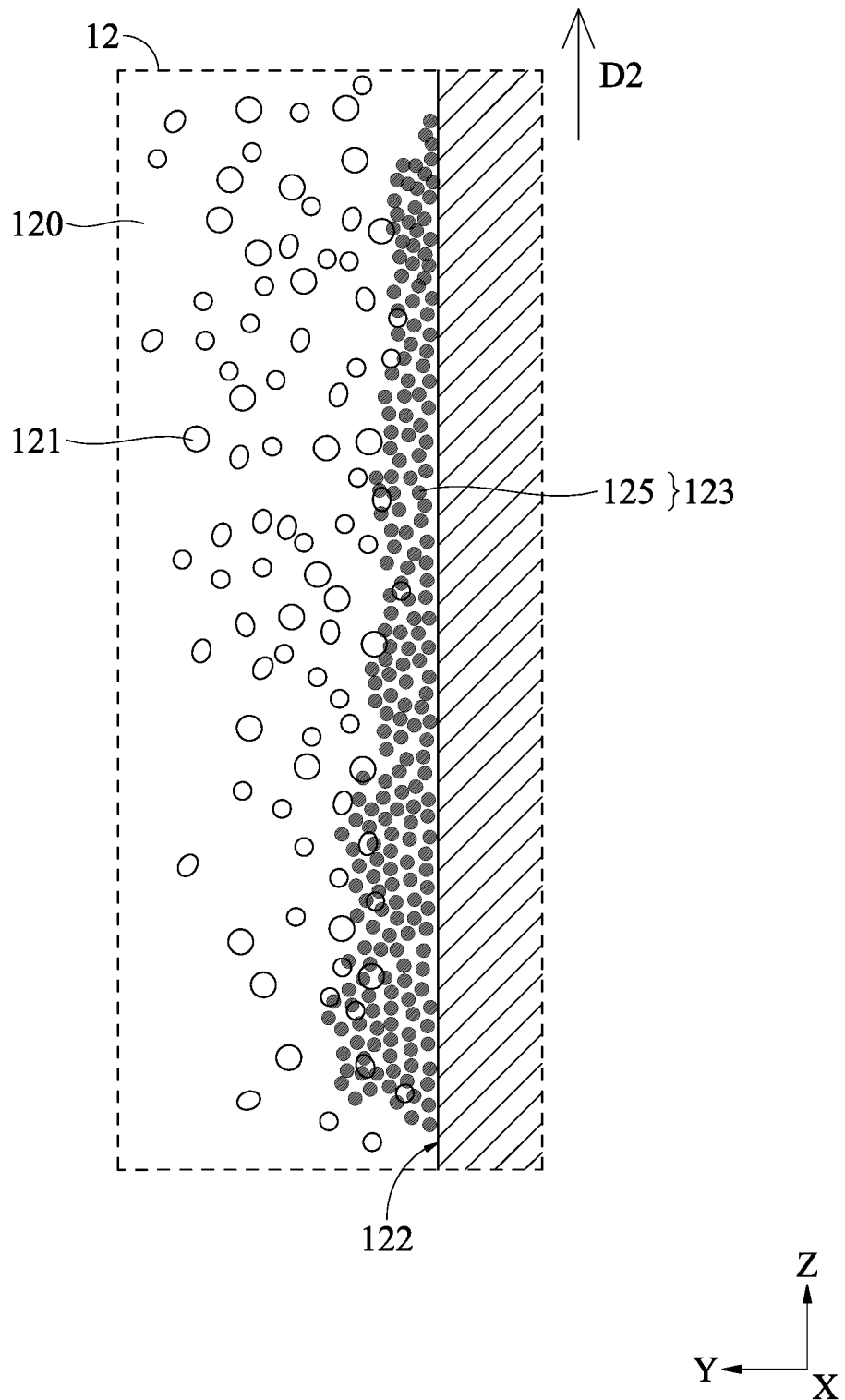
FIG. 8B illustrates a cross-sectional schematic view of the first communication pipeline according to some embodiments.
Figure 8C:
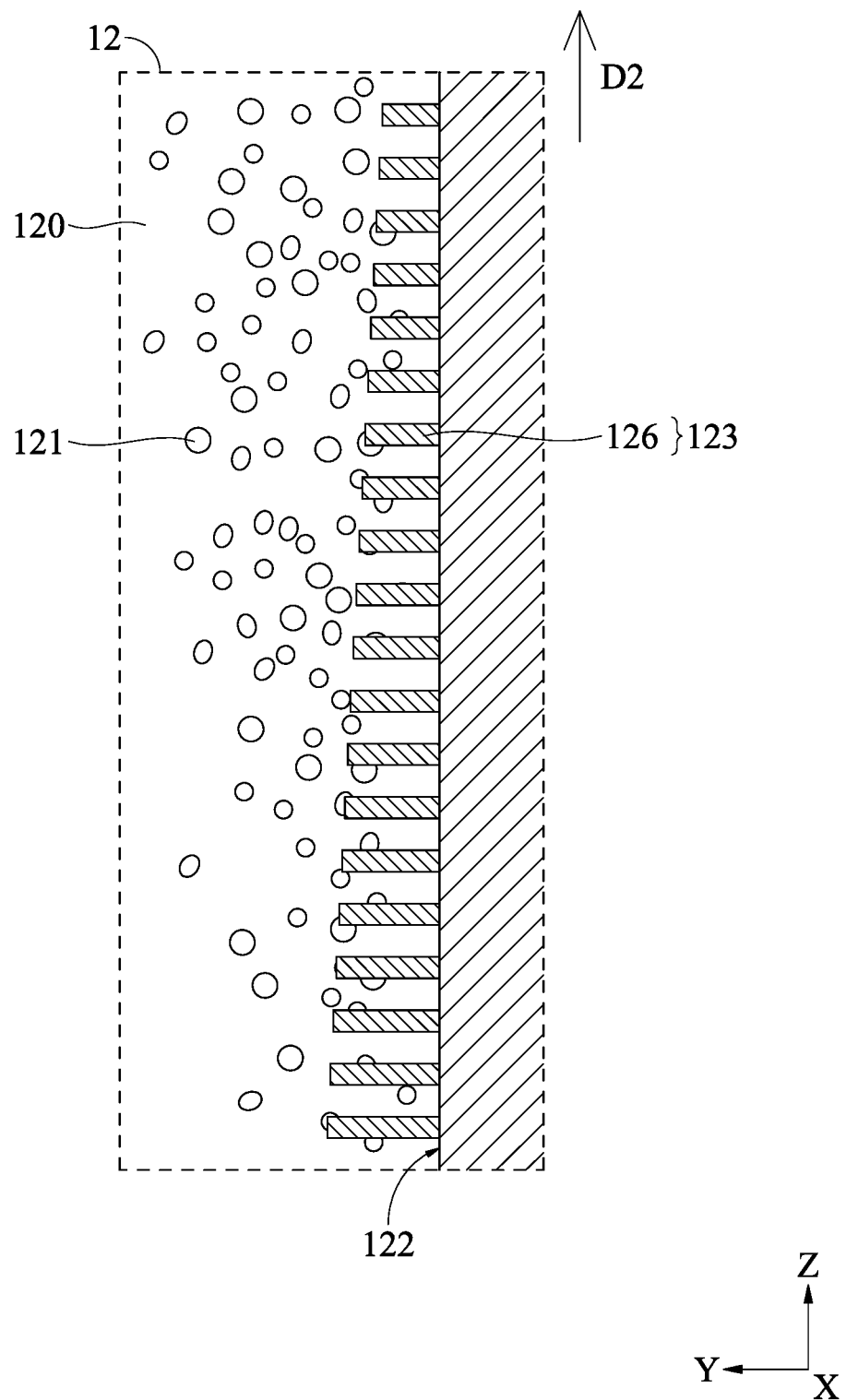
FIG. 8C illustrates a cross-sectional schematic view of the first communication pipeline according to some embodiments.

Please refer to FIG. 1 and FIG. 8A to FIG. 8C. FIG. 8A to FIG. 8C illustrate cross-sectional schematic views of the first communication pipeline 12 according to some embodiments. In FIG. 1, the interior of the first communication pipeline 12 has an inner wall 122 (shown in FIG. 8A to FIG. 8C). The first communication pipeline 12 comprises a pipeline disturbing portion 123, and the pipeline disturbing portion 123 is on the inner wall 122 (shown in FIG. 8A to FIG. 8C). The pipeline disturbing portion 123 may be a mesh 124 (shown in FIG. 8A), metal particles 125 (shown in FIG. 8B), a fin 126 (shown in FIG. 8C), or a combination thereof, which will be described later. In other words, the pipeline disturbing portion 123 may comprise two or three of the mesh 124, the metal particles 125, and the fin 126; for example, the pipeline disturbing portion 123 may comprise a combination of the mesh 124 and the metal particles 125, or a combination of the mesh 124 and the fin 126, or a combination of the metal particles 125 and the fin 126, or a combination of the mesh 124, the metal particles 125, and the fin 126. Through the pipeline disturbing portion 123 on the inner wall 122 of the first communication pipeline 12, when the circulation fluid 120 flows by the first communication pipeline 12, bubbles 121 (i.e., the circulation fluid 120 in gas phase) will be formed on the interface between the circulation fluid 120 (which has a liquid-phase surface) and the pipeline disturbing portion 123 (which has, for example, a solid-phase surface) for the heterogeneous nucleation on the interface. The more the bubbles 121 are formed, the more the heats are removed from the liquid-phase circulation fluid 120, and thus the liquid-phase circulation fluid 120 can be cooled more properly.

For example, in FIG. 8A, the pipeline disturbing portion 123 comprises the mesh 124. The mesh 124 may be in one or more layers, which is not limited; for example, in FIG. 8A, the mesh 124 is in four to five layers. The holes of the mesh 124 and the number of the holes per unit area are not limited and may be configured according to various demands. The materials of the mesh 124 may be metal, alloy, or a combination thereof, which is not limited herein. Accordingly, through the meshes 124 on the inner wall 122 of the first communication pipeline 12, a rougher surface with more cavities and gaps can be formed on the inner wall 122. Therefore, the heterogeneous nucleation can be formed on the rougher surface with more cavities and gaps by the circulation fluid 120, which may be beneficial to the heterogeneous nucleation, and thus forming more bubbles 121.

For another example, in FIG. 8B, the pipeline disturbing portion 123 comprises the metal particles 125. The size and the size distribution of the metal particles 125 are not limited and may be configured according to various demands. The size of the metal particles 125 may be substantially identical to or different from each other, which is not limited herein. The materials of the metal particles 125 may be metal, alloy, or a combination thereof, which is not limited herein; for example, the material of the metal particles 125 is copper. Accordingly, through the metal particles 125 on the inner wall 122 of the first communication pipeline 12, a rougher surface with more cavities and gaps may be formed on the inner wall 122. Therefore, the heterogeneous nucleation can be formed on the rougher surface with more cavities and gaps by the circulation fluid 120, which may be beneficial to the heterogeneous nucleation, and thus forming more bubbles 121. Moreover, in some embodiments, the stacking height of the metal particles 125 (e.g., the height along the Y direction shown in FIG. 8B) may be configured according to various demands; for example, in FIG. 8B, the metal particles 125 on the side of the inner wall 122 adjacent to the outlet 201 (shown in FIG. 1) (that is, the side adjacent to the −Z direction shown in FIG. 8B) are stacked in a greater stacking height, so that more heterogeneous nucleation may be formed by the circulation fluid 120 once the circulation fluid 120 enters the first communication pipeline 12. Hence, the bubbles 121 can be formed more rapidly by the circulation fluid 120, and thus the circulation fluid 120 from the chip device 2 (shown in FIG. 1) can be cooled more properly.

For another example, in FIG. 8C, the pipeline disturbing portion 123 comprises the fin 126. The fin 126 may be one or more, which is not limited; for example, the fin 126 may be a fin array (shown in FIG. 8C). The extending direction of the fin 126 is not limited. For example, in FIG. 8C, a plurality of the fins 126 are aligned along an alignment direction (e.g., the +Z direction or the flow direction D2 shown in FIG. 8C), and the extending direction of each of the fins 126 (e.g., the +Y direction shown in FIG. 8C) is substantially perpendicular to the flow direction D2 of the heat exchange channel 131 (that is, in this embodiment, the flow direction D2 of the circulation fluid 120 inside the heat exchange channel 131). Alternatively, for another example, a plurality of the fins 126 are aligned along an alignment direction (e.g., the circumferential direction of the inner wall 122 of the first communication pipeline 12), and the extending direction of each of the fins 126 (e.g., the +Z direction shown in FIG. 8C) is substantially parallel to the flow direction of the circulation fluid 120 (e.g., the +Z direction or the flow direction D2 shown in FIG. 8C). In other words, the length (e.g., along the Z direction shown in FIG. 8C), the width (e.g., along the X direction shown in FIG. 8C), and the height (e.g., along the Y direction shown in FIG. 8C) of each of the fins 126 may be configured according to various demands, and may respectively be substantially identical to or different from each other, both of which are not limited herein. The pitch between any two of the fins 126 is not limited herein. The materials of the fins 126 may independently be metal, alloy, or a combination thereof, which is not limited herein. Accordingly, through the fin(s) 126 on the inner wall 122 of the first communication pipeline 12, a rougher surface with more cavities and gaps can be formed on the inner wall 122. Therefore, the heterogeneous nucleation can be on the rougher surface with more cavities and gaps by the circulation fluid 120, which may be beneficial to the heterogeneous nucleation, and thus forming more bubbles 121. Moreover, in some embodiments, the height of the fin(s) 126 may be configured according to various demands; for example, in FIG. 8C, the fins 126 on the side of the inner wall 122 adjacent to the outlet 201 (shown in FIG. 1) (that is, the side adjacent to the −Z direction shown in FIG. 8C) are in a greater height, so that more heterogeneous nucleation may be formed by the circulation fluid 120 once the circulation fluid 120 enters the first communication pipeline 12. Hence, the bubbles 121 can be formed more rapidly by the circulation fluid 120, and thus the circulation fluid 120 from the chip device 2 (shown in FIG. 1) can be cooled more properly.

Referring back to FIG. 1, in some embodiments, the immersion cooling system 1 further comprises a cooling device 17, wherein the cooling device 17 is at the side of the chip device 2 away from the motherboard 20; for example, the cooling device 17 is at the side of the cover 22 away from the motherboard 20. The cooling device 17 may be any device that can conduct heat exchange, such as a boiler plate. The materials of the cooling device 17 may be any material with thermal conductive function, which is not limited herein; for example, the materials may be metal, alloy, or a combination thereof. Therefore, through the cooling device 17 that is substantially contacted with the chip device 2 and/or the chip(s) 21 of the chip device 2, the cooling device 17 may conduct heat exchange more properly with the chip device 2 and/or the chip(s) 21 of the chip device 2. Moreover, in some embodiments, one side of the cooling device 17 (e.g., the side adjacent to the motherboard 20) is substantially contacted with the chip device 2 and/or the chip(s) 21 of the chip device 2, and another side of the cooling device 17 (e.g., the side away from the motherboard 20) is substantially contacted with the liquid-phase working fluid 101. Accordingly, through the cooling device 17, the heat of the chip device 2 and/or the chip(s) 21 of the chip device 2 can be removed and thermally conducted more directly and rapidly with the liquid-phase working fluid 101, so that the chip device 2 and/or the chip(s) 21 of the chip device 2 can be cooled more efficiently.

For example, referring to FIG. 1 and FIG. 9A to FIG. 9C, FIG. 9A to FIG. 9C illustrate cross-sectional schematic views of the cooling device 17 according to some embodiments. In FIG. 1, the cooling device 17 has a cooling surface 170 (shown in FIG. 9A to FIG. 9C), and the cooling surface 170 is at the side of the cooling device 17 away from the motherboard 20. The cooling device 17 comprises a cooling disturbing portion 171, and the cooling disturbing portion 171 is on the cooling surface 170 (shown in FIG. 9A to FIG. 9C). The cooling disturbing portion 171 may be a mesh 172

(shown in FIG. 9A), metal particles 173 (shown in FIG. 9B), a fin 174 (shown in FIG. 9C), or a combination thereof, which will be described later. In other words, the cooling disturbing portion 171 may comprise two or three of the mesh 172, the metal particles 173, and the fin 174; for example, the cooling disturbing portion 171 may comprise a combination of the mesh 172 and the metal particles 173, or a combination of the mesh 172 and the fin 174, or a combination of the metal particles 173 and the fin 174, or a combination of the mesh 172, the metal particles 173, and the fin 174. Through the cooling disturbing portion 171 on the cooling surface 170 of the cooling device 17, when the liquid-phase working fluid 101 flows to the proximity of the cooling device 17, bubbles 103 (i.e., the gas-phase working fluid) will be formed on the interface between the liquid-phase working fluid 101 (which has a liquid-phase surface) and the cooling disturbing portion 171 (which has, for example, a solid-phase surface) for the heterogeneous nucleation on the interface, and thus the liquid-phase working fluid 101 can be cooled more properly.

Figure 9A:
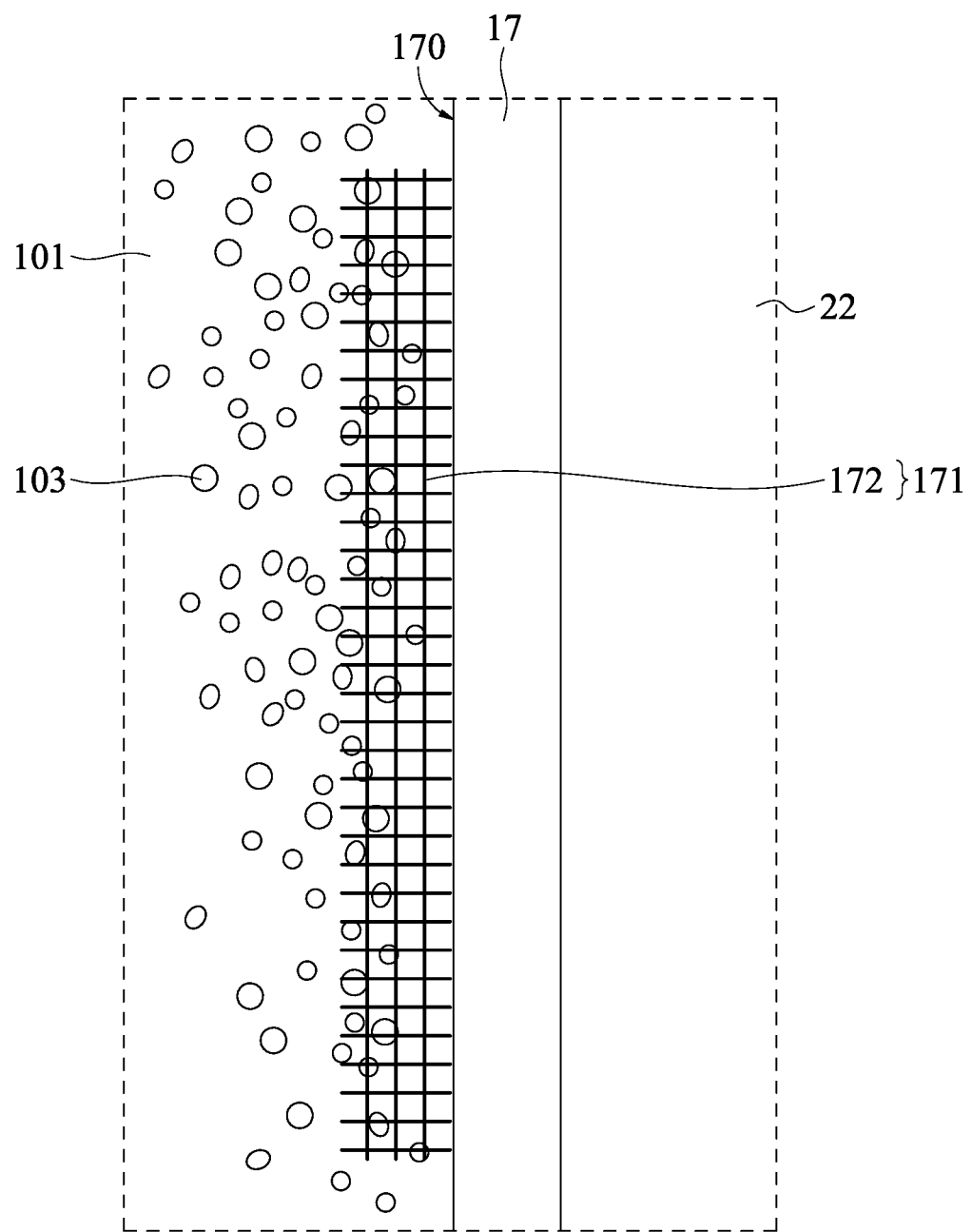
FIG. 9A illustrates a cross-sectional schematic view of the cooling device according to some embodiments.

For example, in FIG. 9A, the cooling disturbing portion 171 comprises the mesh 172. The mesh 172 may be in one or more layers, which is not limited; for example, in FIG. 9A, the mesh 172 is in four to five layers. The holes of the mesh 172 and the number of the holes per unit area are not limited and may be configured according to various demands. The materials of the mesh 172 may be metal, alloy, or a combination thereof, which is not limited herein. Accordingly, through the meshes 172 on the cooling surface 170 of the cooling device 17, a rougher surface with more cavities and gaps can be formed on the inner wall 122. Therefore, the heterogeneous nucleation can be formed on the rougher surface with more cavities and gaps by the liquid-phase working fluid 101, which may be beneficial to the heterogeneous nucleation, and thus forming more bubbles 103.

Figure 9B:
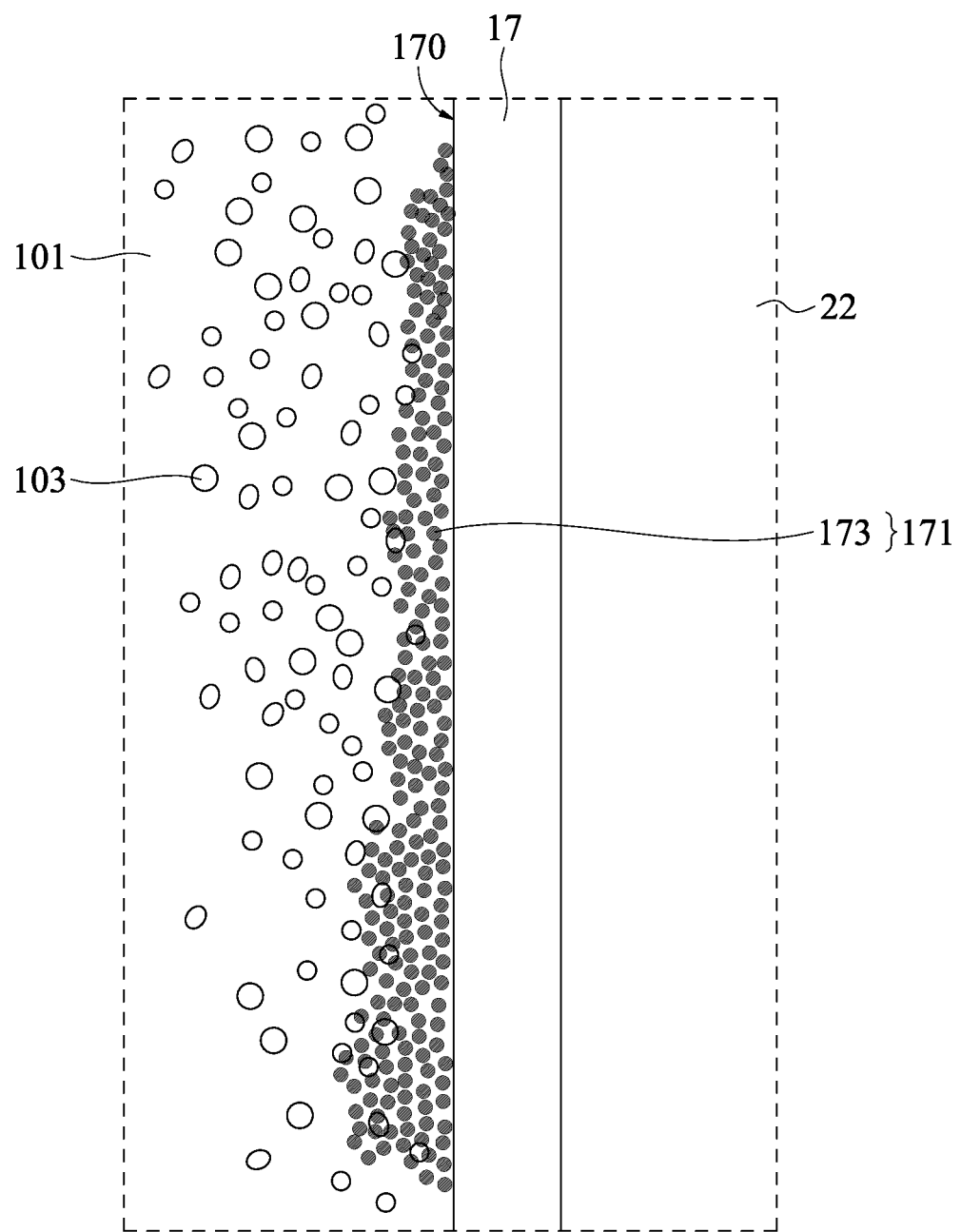
FIG. 9B illustrates a cross-sectional schematic view of the cooling device according to some embodiments.

For another example, in FIG. 9B, the cooling disturbing portion 171 comprises the metal particles 173. The size and the size distribution of the metal particles 173 are not limited and may be configured according to various demands. The size of the metal particles 173 may be substantially identical to or different from each other, which is not limited herein. The materials of the metal particles 173 may be metal, alloy, or a combination thereof, which is not limited herein; for example, the material of the metal particles 173 is copper. Accordingly, through the metal particles 173 on the cooling surface 170 of the cooling device 17, a rougher surface with more cavities and gaps may be formed on the cooling surface 170. Therefore, the heterogeneous nucleation can be formed on the rougher surface with more cavities and gaps by the liquid-phase working fluid 101, which may be beneficial to the heterogeneous nucleation, and thus forming more bubbles 103. Moreover, in some embodiments, the stacking height (e.g., the height along the Y direction shown in FIG. 9B) of the metal particles 173 may be configured according to various demands; for example, in FIG. 9B, the metal particles 173 on the side of the cooling surface 170 towards the gravity direction (e.g., the −Z direction shown in FIG. 9B) are stacked in a greater stacking height, so that more heterogeneous nucleation may be formed on the side towards the gravity direction (e.g., the side that is away from the flow direction of the bubbles 103) by the liquid-phase working fluid 101. Hence, the bubbles 103 can be formed more rapidly by the liquid-phase working fluid 101. Furthermore, some of the bubbles 103 may be combined to each other to form larger bubbles when flowing to the surface of the liquid-phase working fluid 101, so that much more heat can be removed from the liquid-phase working fluid 101. Accordingly, according to some embodiments, the liquid-phase working fluid 101 in a wider range can be cooled by the cooling disturbing portion 171 at one time, thereby enhancing the cooling performance of the liquid-phase working fluid 101.

Figure 9C:
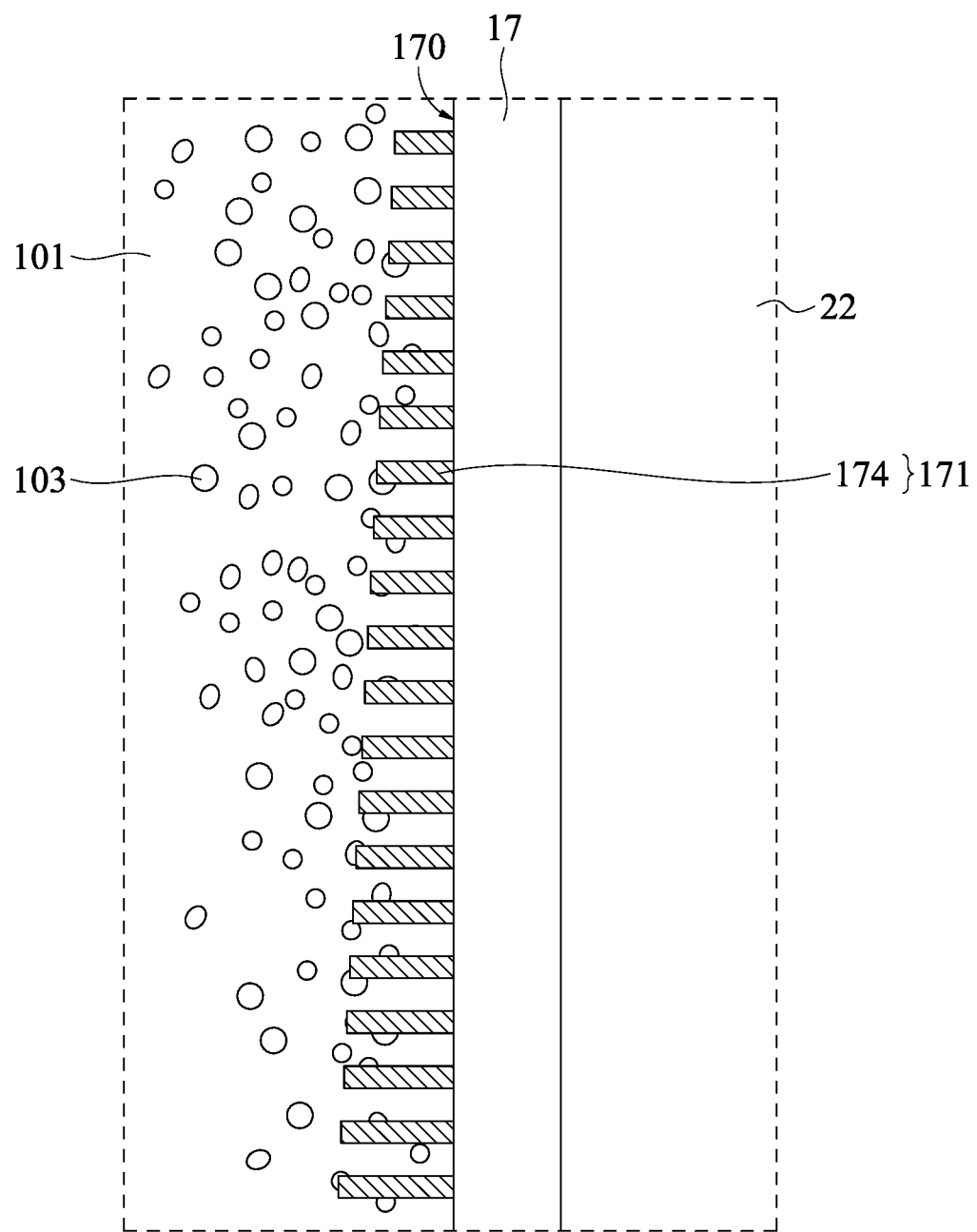
FIG. 9C illustrates a cross-sectional schematic view of the cooling device according to some embodiments.

For another example, in FIG. 9C, the cooling disturbing portion 171 comprises the fin 174. The fin 174 may be one or more, which is not limited; for example, the fin 174 may be a fin array (shown in FIG. 9C). The extending direction of the fin 174 is not limited. For example, in FIG. 9C, a plurality of the fins 174 are aligned along an alignment direction (e.g., the +Z direction shown in FIG. 9C), and the extending direction (e.g., the +Y direction shown in FIG. 9C) of each of the fins 174 is substantially perpendicular to the flow direction of the liquid-phase working fluid 101 (e.g., the +Z direction shown in FIG. 9C). Alternatively, for another example, a plurality of the fins 174 are aligned along an alignment direction (e.g., the X direction shown in FIG. 9C), and the extending direction of each of the fins 174 (e.g., the +Z direction shown in FIG. 9C) is substantially parallel to the flow direction of the liquid-phase working fluid 101 (e.g., the +Z direction shown in FIG. 9C). In other words, the length (e.g., along the Z direction shown in FIG. 9C), the width (e.g., along the X direction shown in FIG. 9C), and the height (e.g., along the Y direction shown in FIG. 9C) of each of the fins 174 may be configured according to various demands, and may respectively be substantially identical to or different from each other, which is not limited herein. The pitch between any two of the fins 174 is not limited herein. The materials of the fins 174 may independently be metal, alloy, or a combination thereof, which is not limited herein. Accordingly, through the fin(s) 174 on the cooling surface 170 of the cooling device 17, a rougher surface with more cavities and gaps can be formed on the cooling surface 170. Therefore, the heterogeneous nucleation can be formed on the rougher surface with more cavities and gaps by the liquid-phase working fluid 101, which is beneficial to the heterogeneous nucleation, and thus forming more bubbles 103. Moreover, in some embodiments, the height of the fin(s) 174 may be configured according to various demands; for example, in FIG. 9C, the fins 174 on the side of the cooling surface 170 towards the gravity direction (e.g., the −Z direction shown in FIG. 9C) are in a greater height, so that more heterogeneous nucleation may be formed on the side towards the gravity direction (e.g., the side that is away from the flow direction of the bubbles 103) by the liquid-phase working fluid 101. Hence, the bubbles 103 can be formed more rapidly by the liquid-phase working fluid 101. Furthermore, some of the bubbles 103 may be combined to each other to form larger bubbles when flowing to the surface of the liquid-phase working fluid 101, so that much more heat can be removed from the liquid-phase working fluid 101. Accordingly, according to some embodiments, the liquid-phase working fluid 101 in a wider range can be cooled by the cooling disturbing portion 171 at one time, thereby enhancing the cooling performance of the liquid-phase working fluid 101.

To sum up, in some embodiments, by configuring a chip device to be in communication with cooling pipelines (e.g., a microchannel device, a first communication pipeline, and a first heat exchange device) that are also inside the system (or inside the work tank of the system), according to some embodiments, the cooling pipelines of an immersion cooling system can be prevented from being in communication with the exterior of the system (or the exterior of the work tank of the system). Therefore, according to some embodiments, through the cooling pipelines inside the system (and thus the length of the cooling pipeline may be much shorter as compared to that of the prior arts known to the inventor), the immersion cooling system can still achieve the cooling performance substantially equal to or even superior to that of the prior arts known to the inventor by consuming a less pumping power.

What is claimed is:

1. An immersion cooling system comprising: a work tank comprising a fluid section; a chip device in the fluid section and having an inlet and an outlet, wherein the chip device comprises: a motherboard having a main surface substantially parallel to a vertical line; a chip; and a cover on the motherboard, wherein the chip is between the cover and the motherboard; a microchannel device in the chip device, wherein a first end of the microchannel device is in communication with the inlet, and wherein a second end of the microchannel device is in communication with the outlet; a first communication pipeline in the fluid section, wherein a first end of the first communication pipeline is in communication with the outlet; and a first heat exchange device in the fluid section and in communication with a second end of the first communication pipeline-; wherein the work tank further comprises a vapor section, and the immersion cooling system further comprises a second heat exchange device in the vapor section.

2. The immersion cooling system according to claim 1, wherein the inlet is selectively on the motherboard, or on the cover, or on both the motherboard and the cover; and the outlet is selectively on the motherboard, or on the cover, or on both the motherboard and the cover.

3. The immersion cooling system according to claim 2, wherein:
the inlet is on the motherboard or the cover;
the outlet is on the motherboard or the cover; and
the microchannel device comprises:
  a first microchannel, wherein a first end of the first microchannel is in communication with the chip, a second end of the first microchannel is in communication with the outlet, and a diameter of the first microchannel is less than a diameter of the first communication pipeline; and
  a second microchannel, wherein a first end of the second microchannel is in communication with the chip, and a second end of the second microchannel is in communication with the inlet.

4. The immersion cooling system according to claim 3, further comprising a second communication pipeline, wherein the second communication pipeline is in the fluid section and in communication with the inlet.

5. The immersion cooling system according to claim 4, further comprising a pump, wherein the pump is in the fluid section and in communication with the second communication pipeline.

6. The immersion cooling system according to claim 5, wherein the chip device is electrically connected to the pump to supply an electricity for the pump and control the pump.

7. The immersion cooling system according to claim 6, wherein the pump is on the motherboard to be electrically connected to the motherboard.

8. The immersion cooling system according to claim 5, further comprising a third communication pipeline, wherein the third communication pipeline is in the fluid section, a first end of the third communication pipeline is in communication with the first heat exchange device, and a second end of the third communication pipeline is in communication with the pump.

9. The immersion cooling system according to claim 3, further comprising a cooling device, wherein the cooling device is at a side of the chip device away from the motherboard.

10. The immersion cooling system according to claim 9, wherein the cooling device is at a side of the cover away from the motherboard.

11. The immersion cooling system according to claim 10, wherein the cooling device has a cooling surface, the cooling surface is at a side of the cooling device away from the motherboard, and the cooling device comprises a cooling disturbing portion on the cooling surface.

12. The immersion cooling system according to claim 11, wherein the cooling disturbing portion is a mesh, a plurality of metal particles, a fin, or a combination comprising two or more of the mesh, the metal particles, and the fin.

13. The immersion cooling system according to claim 3, wherein the first communication pipeline has an inner wall, and the first communication pipeline comprises a pipeline disturbing portion on the inner wall.

14. The immersion cooling system according to claim 13, wherein the pipeline disturbing portion is a mesh, a plurality of metal particles, a fin, or a combination comprising two or more of the mesh, the metal particles, and the fin.

15. The immersion cooling system according to claim 3, wherein the first heat exchange device comprises a plurality of heat exchange channels, and a flow direction of each of the heat exchange channels is substantially perpendicular to the vertical line.

16. The immersion cooling system according to claim 3, wherein the first heat exchange device comprises a plurality of heat exchange channels, and a flow direction of each of the heat exchange channels is substantially parallel to the vertical line.

17. The immersion cooling system according to claim 3, wherein the work tank further comprises a vapor section, the immersion cooling system further comprises a second heat exchange device, and the second heat exchange device comprises:
a condenser in the vapor section;
a condensing pump; and
a heat exchanger, wherein a first end of the condensing pump is in communication with a first end of the condenser, a second end of the condensing pump is in communication with a first end of the heat exchanger, and a second end of the heat exchanger is in communication with a second end of the condenser.

18. The immersion cooling system according to claim 17, wherein the condensing pump is outside the work tank.

19. The immersion cooling system according to claim 17, wherein the heat exchanger is outside the work tank.

20. The immersion cooling system according to claim 3, wherein the first heat exchange device comprises a partition plate and a plurality of heat exchange channels, and the heat exchange channels are partitioned by the partition plate.

21. The immersion cooling system according to claim 2, wherein:
the inlet is on both the motherboard and the cover;
the outlet is on both the motherboard and the cover; and
the microchannel device comprises:
  a plurality of first microchannels, wherein a first end of each of the first microchannels is in communication with the chip, a second end of each of the first microchannels is in communication with the outlet, and a diameter of each of the first microchannels is less than a diameter of the first communication pipeline; and a plurality of second microchannels, wherein a first end of each of the second microchannels is in communication with the chip, and a second end of each of the second microchannels is in communication with the inlet.

\* \* \* \* \*